United States Patent [19]

Price

[11] Patent Number: 4,758,982
[45] Date of Patent: Jul. 19, 1988

[54] QUASI CONTENT ADDRESSABLE MEMORY

[75] Inventor: Simon M. Price, Mountain View, Calif.

[73] Assignee: Advanced Micro Devices, Inc., Sunnyvale, Calif.

[21] Appl. No.: 817,230

[22] Filed: Jan. 8, 1986

[51] Int. Cl.[4] .................... G06F 13/00; G11C 13/00
[52] U.S. Cl. .................................... 364/900; 365/49
[58] Field of Search ........................................ 365/49; 364/200 MS File, 900 MS File

[56] References Cited

U.S. PATENT DOCUMENTS

| | | | |
|---|---|---|---|
| 4,112,502 | 9/1978 | Scheuneman | 364/900 |
| 4,241,401 | 12/1980 | De Ward et al. | 364/200 |
| 4,523,301 | 6/1985 | Kadota et al. | 365/49 |
| 4,532,606 | 7/1985 | Phelps | 365/49 |
| 4,538,243 | 8/1985 | Zehner | 365/49 |
| 4,646,271 | 2/1987 | Uchiyama et al. | 365/49 |
| 4,656,626 | 4/1987 | Yudichak et al. | 370/68 |
| 4,669,043 | 5/1987 | Kaplinsky | 364/200 |
| 4,670,858 | 1/1987 | Almy | 365/49 |
| 4,680,760 | 7/1987 | Giles et al. | 371/21 |

Primary Examiner—Gary V. Harkcom
Assistant Examiner—Randy W. Lacasse
Attorney, Agent, or Firm—Patrick T. King; Paul L. Hickman; Davis Chin

[57] ABSTRACT

A quasi content addressable memory circuit including a CAM section, a RAM section, and a comparator. A first part of an incoming comparand is applied to the CAM section, while a second part of the incoming comparand is applied to the comparator. If there is a favorable comparison within the CAM section with the first part of the comparand, the CAM section develops a pointer which addresses the RAM. The output of the RAM is then compared to the second part of the comparand and, if a favorable comparison is made, a match flag is developed. Also disclosed are circuits for handling multiple responses by the CAM section, and a practical comparator RAM which combines the functions of the comparator and the RAM of the quasi content addressable memory circuit.

6 Claims, 4 Drawing Sheets

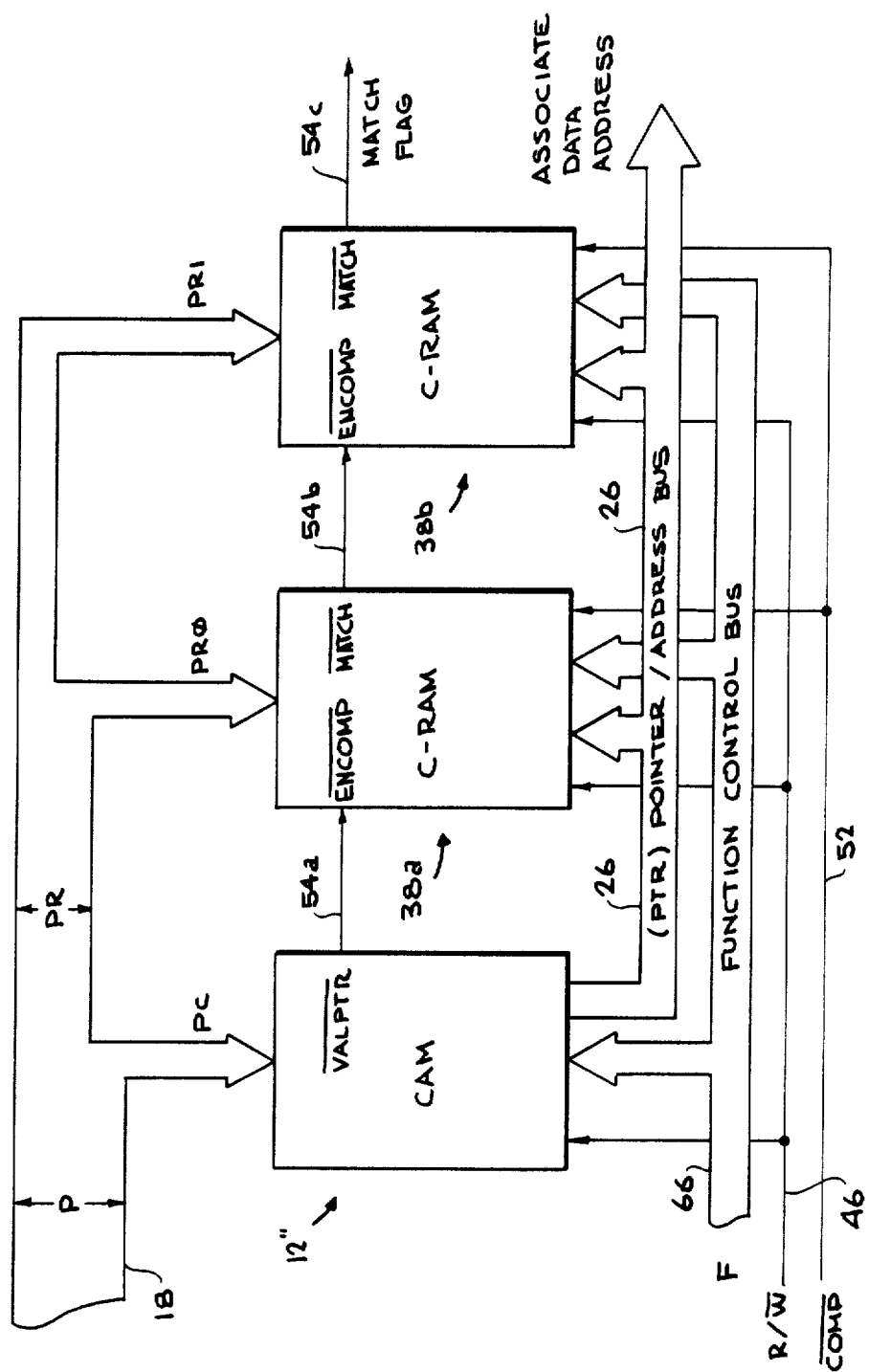

QUASI CONTENT ADDRESSABLE MEMORY

BACKGROUND OF THE INVENTION

1. Field of the Invention

This invention relates to digital read/write memory, and more particularly to a hybrid of content addressable and random access memory.

2. Description of the Related Art

The most common type of digital read/write memory is random access memory (RAM). RAM is responsive to an address bus and a control bus, and generally has a bidirectional data bus. An address is put on the address bus by a central processing unit (CPU), direct memory access (DMA) device, or other addressing device to specify a unique storage location within the RAM. The addressing mechanism of a RAM is said to be unambiguous since each address on the address bus specifies one and only one storage location within the RAM.

While RAM is well suited for many digital applications, it is not particularly well suited for use in systems which process associative data. For example, the sequential access to data when addressing RAM can be inefficient for systems involved in pattern recognition, natural language recognition, sparse matrix processing, and database interrogation.

A type of digital read/write memory which is better suited for systems which process associative data is known as content addressable memory (CAM). Storage locations within CAM are addressed simultaneously and in parallel by an incoming bit pattern called a comparand. Part of the contents of each storage location within the CAM can be considered to be an address field, where the remainder of the storage location can be considered to be an associated data field. When the associated data field is used to address another device, it is sometimes called a pointer field and is said to contain a pointer address.

With a CAM the comparand is compared, in parallel, to the address fields of all storage locations, and if the address fields have the desired relationship to the comparand the associated data field at that location can be accessed. Alternatively, the comparand can be compared to the entirety of each of the storage locations to detect whether the the particular bit pattern corresponding to the comparand is stored within the CAM, in which case the presence or absence of the comparand amongst the contents is indicated by a Boolean output signal (flag).

A typical CAM includes a comparand input bus, a control input bus, a valid match output, and a bidirectional data bus. A number of comparison operations built into the CAM and selected by the control bus may be allowable, including equality, inequality, less than, greater than, etc.

CAM, as opposed to RAM, may have ambiguous addresses. In other words, a number of address fields within the CAM may hold the same contents. If ambiguous addressing is allowed, then multiple responses will result upon a compare. Multiple responses from a CAM are usually accessed serially.

The amount of memory required by a digital system is often greater than that available on a single device. Furthermore, by being able to build a memory system from a number of memory devices the architecture of the memory system is not limited by the architecture of the memory device. In consequence, a number of individual memory devices are commonly connected horizontally and/or vertically in a matrix configuration. The horizontal connection of memory elements increases the effective width of a stored word of memory, and the vertical connection of memory elements increases the number of memory locations available in the memory system.

With RAM memory, the methods for horizontally and vertically connecting memory devices are well known. The vertical connection of CAM elements is likewise a straightforward matter. However, engineers attempting the horizontal cascading of CAM elements have had trouble in achieving their goals because of the difficulties involved in conveying match information between the CAM elements. In the past, the conveyance of match information required multi-cycle comparisons of the individual devices, or an unacceptably large number of intersubfield bus lines.

The only known commercially available CAM device which provides a solution to the horizontal cascading problem is the Fairchild F100142 $4 \times 4$ CAM, which has one open emitter line associated with each memory location to convey intersubfield linking information. This solution requires one pin per memory location for intersubfield communication, resulting in a chip of very low data storage capacity. For example, using the Fairchild F100142 device, a modest $1 K \times 16$ CAM system would require 1024 devices, each residing in a 28 pin package and consuming up to 288 mA at 4.2 V. This hypothetical memory system would therefore consume over 1.2 kilowatts of power. Such a system is inappropriate for most applications.

CAM devices are relatively more expensive than RAM devices of the same storage capacity. One reason for this is that the circuitry of CAM is intrinsically more complex than the circuitry of RAM. Each memory cell within a CAM must have both storage capabilities and comparison capabilities, while RAM only needs to have the storage capabilities. Furthermore, the control logic of a CAM tends to be more complex than the control logic of a RAM. Another reason for the cost disparity between the two types of devices is that many more RAM devices are manufactured than CAM devices, allowing for lower production costs for RAM.

SUMMARY OF THE INVENTION

An object of this invention is to produce a memory architecture which behaves much like content addressable memory, but which is closer in cost to random access memory.

Another object of this invention is to produce a memory architecture as described above which further permits straightforward and cost effective horizontal cascading of CAM-like devices.

Briefly, a quasi content addressable memory circuit in accordance with the present invention includes a CAM device, a RAM device, and a comparator. A comparand is split into a comparand CAM field which is applied to the CAM device, and into a comparand RAM field which is applied to one port of the comparator. If the comparand CAM field matches a content of one of the memory locations within the CAM, the CAM develops a RAM pointer address and a pointer valid signal which respectively address and enable the RAM device. The output data of the RAM device is input into another port of the comparator to permit the comparison of the RAM data with the comparand RAM field. If the RAM data as addressed by the pointer address compares favorably to the comparand RAM field, the comparator produces a match flag to indicate a match between the comparand and data stored across both the CAM and RAM.

The invention also includes a comparator RAM circuit which combines the capabilities of a RAM device and a comparator device. The comparator RAM (C-RAM) includes a RAM circuit responsive to a pointer address, a comparator circuit which compares data from the RAM with a RAM comparand, function select logic, and a bidirectional bus driver coupling the comparand/data bus to the RAM data bus. An arbitrary number of comparator RAMs of this present invention can be horizontally cascaded from a single CAM device.

An advantage of this invention is that low cost RAM devices can be used to implement a memory system which behaves, in many respects, like a content addressable memory system but at a much lower cost.

Another advantage of this invention is that C-RAMs of the present invention can be easily horizontally cascaded to meet the arbitrary needs of memory designers.

Other objects, features and advantages of the present invention will become apparent upon consideration of the following detailed description and the accompanying drawings, in which like reference designations represent like features throughout the figures.

BRIEF DESCRIPTION OF THE DRAWINGS

FIG. 4 is block diagram illustrating the horizontal cascading of two of the C-RAMs shown in FIG. 3 with a CAM device.

DETAILED DESCRIPTION OF THE INVENTION

Reference is made now in detail to a specific embodiment of the present invention, which illustrates the best mode presently contemplated by the inventor for practicing the invention. Alternative embodiments are also briefly described as applicable.

Figure 1:
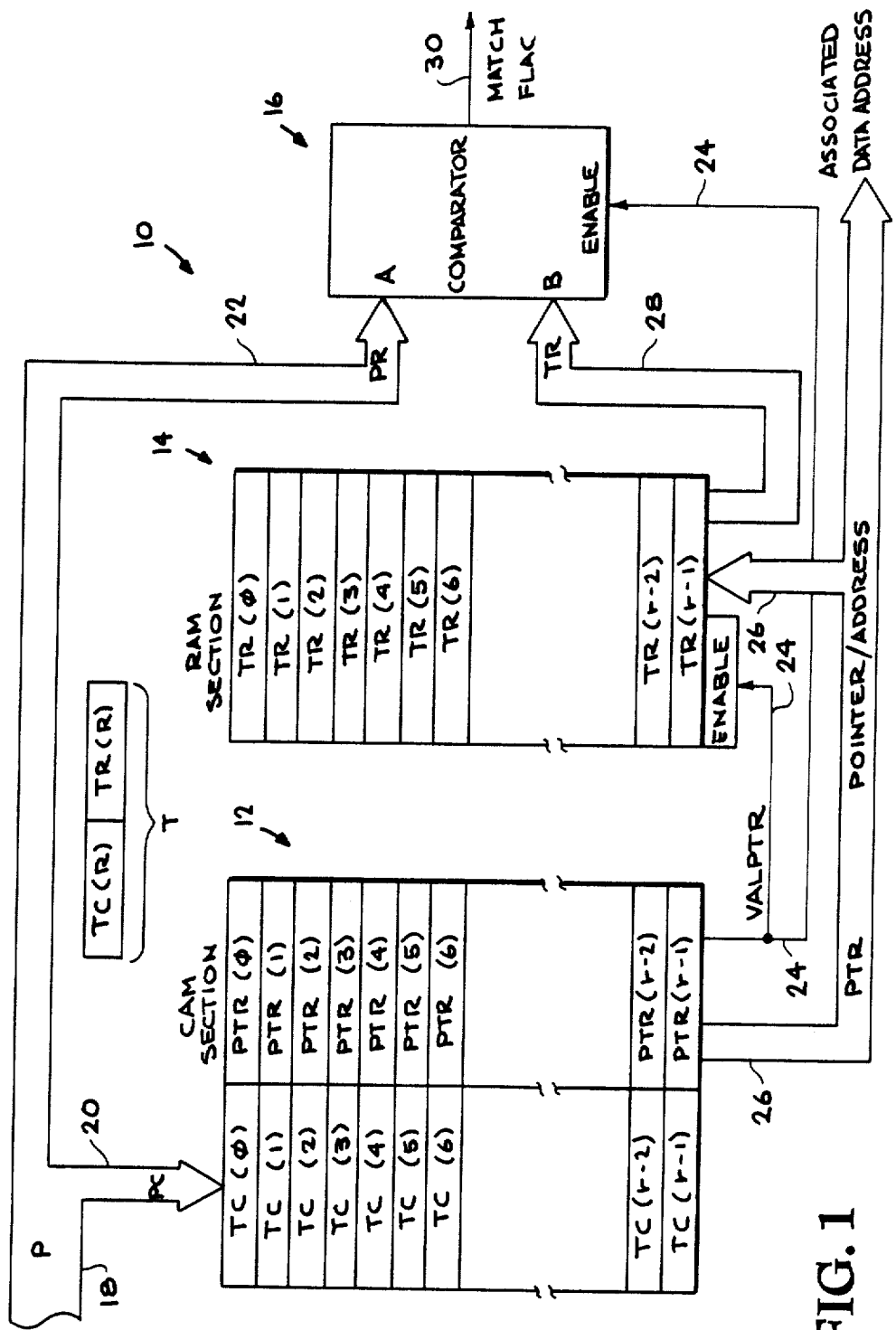
FIG. 1 is a block diagram view of a quasi content addressable memory (Q-CAM) circuit in accordance with the present invention.

Referring to FIG. 1, a quasi content addressable memory circuit 10 includes a CAM section 12, a RAM section 14, and a comparator 16. For purpose of brevity, quasi content addressable memory circuit 10 will be referred to as Q-CAM 10.

Q-CAM 10 is responsive to a comparand P carried by a comparand bus 18. The comparand bus is split into a first portion 20 which carries a comparand CAM field PC and a second portion 22 which carries a comparand RAM field PR. PC inputs into CAM section 12, and PR inputs into a port A of comparator 16.

CAM section 12 includes r memory locations, each of which can store a content CAM field TC. A pointer PTR is associated with each content CAM field TC. Since there are r memory locations in CAM section 12, the content CAM field can be referenced by TC(R), where $0 <= R <= r-1$. Similarly, the pointer can be referenced by PTR(R).

When CAM section 12 is enabled for a comparison, the comparand CAM field PC is compared, in parallel, to all of the content CAM fields TC within the CAM. If there is a favorable comparison between the comparand CAM field PC and one of the content CAM fields TC, a valid pointer VALPTR) signal is developed on a line 24. The CAM section 12 will also develop a pointer PTR on a pointer/address bus 26 which is derived from the PTR(R) corresponding to the content CAM field TC which matches a comparand CAM field PC. For example, if PC matches TC(5), a PTR will be developed on bus 26 which is derived from PTR(5), and a VALPTR signal will be developed on line 24 to indicate that there has been a valid match.

RAM section 14 can be of standard RAM design, and also preferably includes r memory locations. Stored within RAM 14 are content RAM fields TR, which are referenced as TR(R). It should be noted that while the CAM section 12 and the RAM section 14 have the same number of memory locations in this preferred embodiment, that this is not a system requirement.

RAM section 14 in FIG. 1 is assumed to be selected for a read cycle, and can be enabled by the valid pointer signal VALPTR on line 24. When the RAM section 14 is enabled by VALPTR, the pointer/address on bus 26 causes RAM section 14 to output a content RAM field TR on a RAM data bus 28. Using the previous example, if the PTR on bus 26 is equal to PTR(5), then the TR on RAM data bus 28 equals TR(5).

Comparator 16 compares the comparand RAM field PR which is input on a port A to content RAM field TR which is input on a port B. Comparator 16 is enabled by VALPTR on line 24. The comparison function performed by comparator 16 can be any arithmetic logic function, such as equals, greater than, less than, between the range of, section 12. If there is a favorable comparison between comparand CAM field PC and a content CAM field TC(R) within CAM section 12, and a favorable comparison between comparand RAM field PR and content RAM field TR(R) in comparator 16, the comparator 16 will produce a match flag on a line 30.

A match within the CAM section 12 does not ensure a match between the entire comparand P and the entire stored content T at a particular memory location R, where T is stored across TC(R) and TR(R). It is therefore the function of comparator 16 to compare the comparand RAM field PR to the content RAM field TR to ensure that the entirety of comparand P compares favorably to the entirety of the stored content T.

In effect, the hybrid CAM/RAM circuit of FIG. 1 increases the efficiency of searching a RAM for a specific content. If it is assumed that with the circuit of FIG. 1 there are no multiple responses to the CAM, only one pointer PTR is produced upon a match and the circuit behaves like a purely CAM circuit. If the content CAM fields TC contain some duplicate contents, multiple responses from the CAM section 12 are inevitable.

Figure 2:
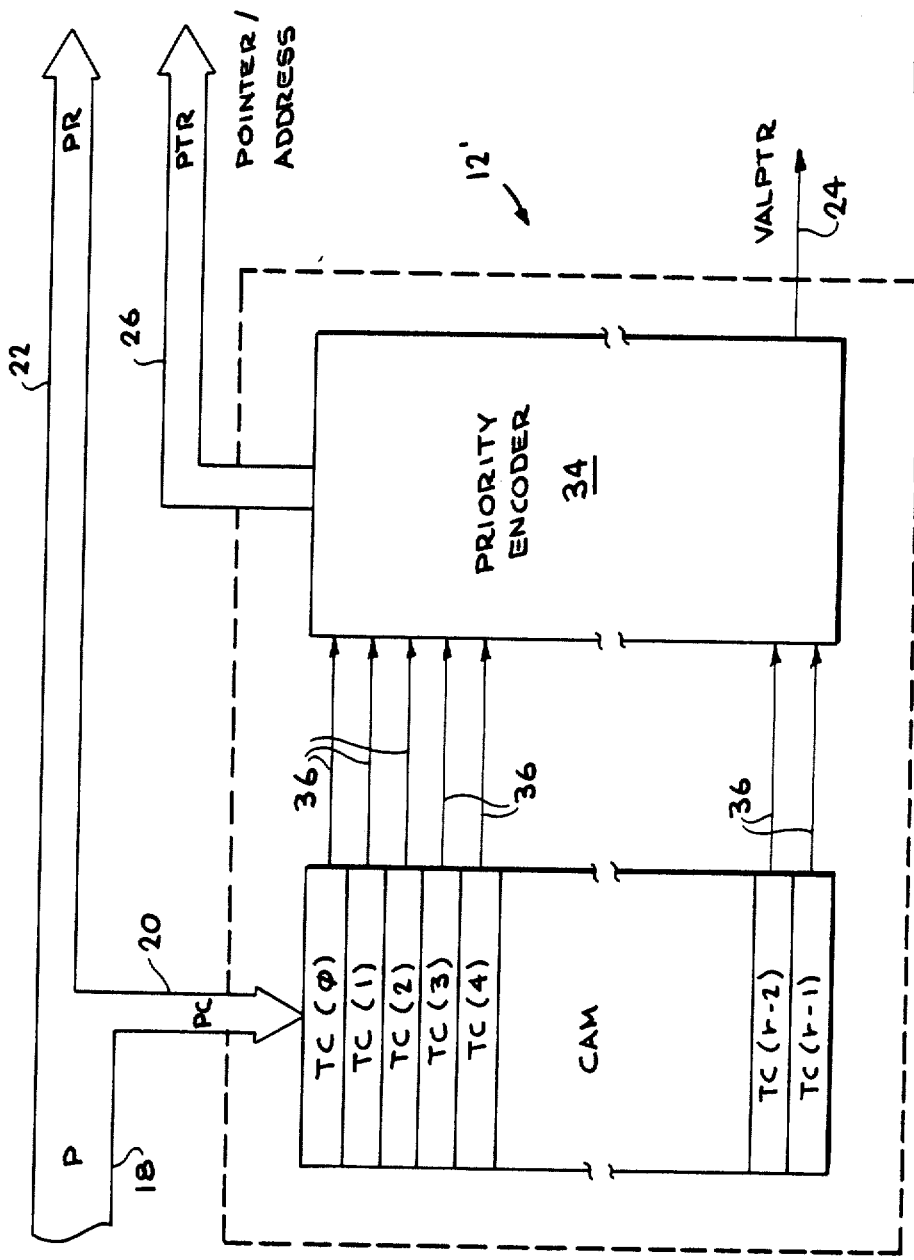
FIG. 2 is an alternate embodiment for the CAM section shown in FIG. 1.

In FIG. 2, a CAM section 12' is disclosed which includes a plurality of CAM memory locations TC(R), and a multiple response handling circuit 34 which generates the pointer PTR. In this case, the multiple response handling circuit 34 is a priority encoder, although other types of multiple response handling circuits are also possible.

Still referring to FIG. 2, when the comparand CAM field PC is applied to CAM memory locations TC(R), a match flag signal is developed on a line 36 corresponding to each memory location TC(R) which matches the comparand CAM field PC. Priority encoder 34 prioritizes the match flag signals, and sequentially outputs PTR values on pointer/address bus 26. The priority encoder 34 also develops a valid pointer VALPTR signal on line 24 when there is at least one valid match flag signal developed by the CAM section 12'.

It should be noted that multiple responses must be dealt with serially. The pointer PTR developed by the CAM is a "guess" of the content T stored across the CAM and RAM. In a system where ambiguous writes are suppressed, i.e. stored contents T are unique, there are as many guesses as there are favorable comparisons between the comparand CAM field PC and the content CAM field TC. Thus, any ambiguity in the CAM section will generate incorrect guesses requiring several sequential accesses to the RAM section.

If the stored content T is D bits wide, the content CAM field TC is c bits wide, and the Q-CAM 10 is A words long, it is possible to make an estimate of the average number of guesses required to compare the comparand P to all of the stored contents T. Assuming that the distribution of values of content CAM fields TC among the A words is entirely random, then the average number of occurrences k for each word is $k = A/2^c$. Upon accessing the entire memory, the average number of sequential accesses into the CAM section necessary to establish a valid content within the entire system is k for ambiguously written contents, and k/2 for non-ambiguously written contents.

The width c of content CAM field TC is a function both of the number of words A in the system and the desired average number of occurrence of each word k. More specifically, $c = \log_2 A - \log_2 k$. When $k = 1$, this equation reduces to $c = \log_2 A$, where the number of bits in the content CAM field PC equals to the number of bits to randomly address the CAM. Under these conditions the CAM is known as being "logarithmically square".

The probability Pr(x) of x occurrences of one particular value out of $2^c$ values randomly selected A times can be approximated as $Pr(x) \approx (k^x/x!)(1/e)^k$. Therefore, a linear increase in the width of the content CAM field TC results in a logarithmic reduction of k, while a linear increase in A causes only a linear increase in k. In a logarithmically square CAM where $k = 1$, the probability of 0 or 1 multiple responses is approximately 74%, while the chance of having five multiple responses is only, 0.31%. The probability of erroneous CAM matches decreases as k decreases, which in many cases would imply the desirability of a small value for k.

Figure 3:
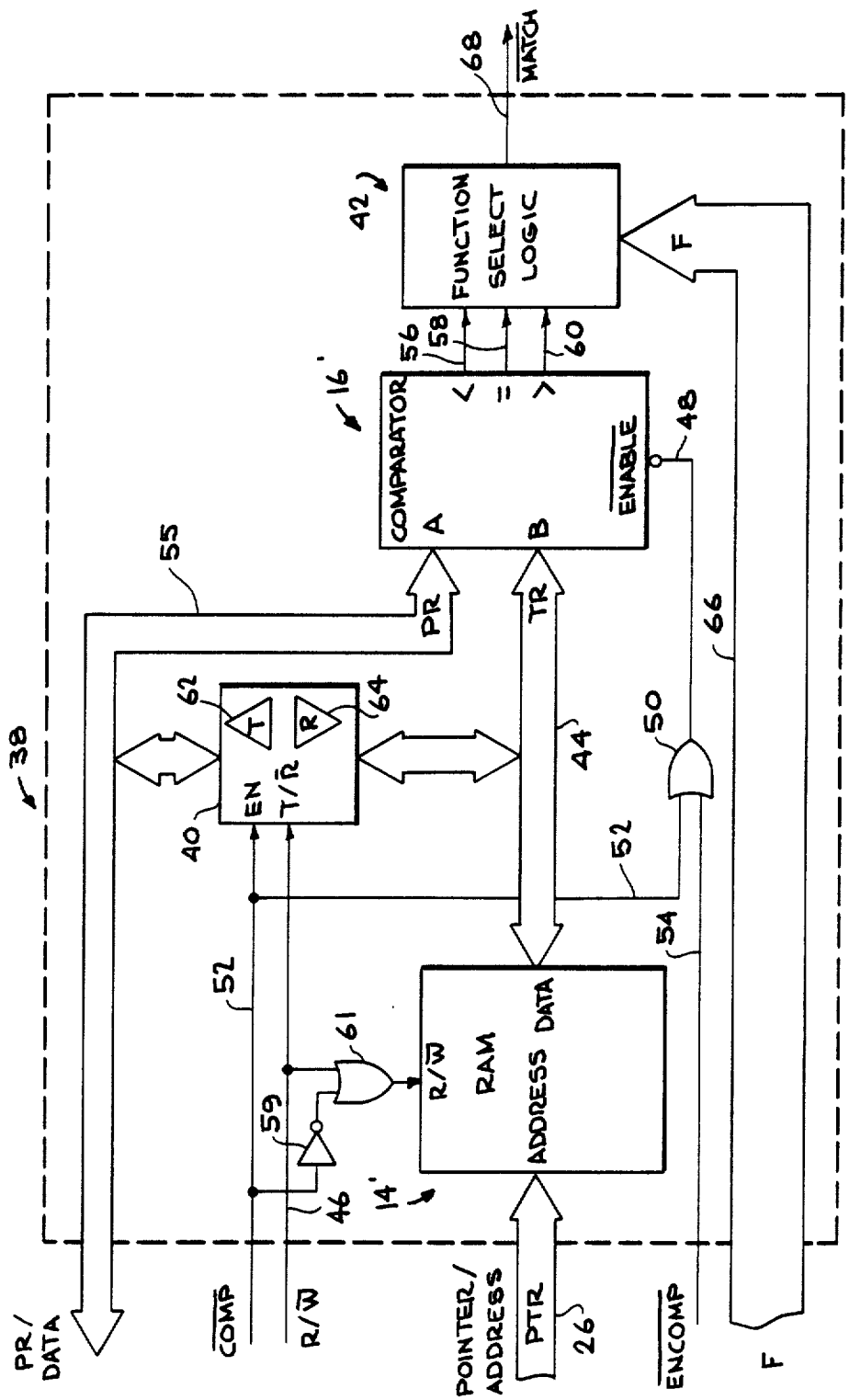
FIG. 3 is a block diagram of a comparator RAM (C-RAM) which includes- the functions of the RAM section and the comparator shown in FIG. 1.

In FIG. 3, a comparator RAM (C-RAM) 38 includes a RAM 14 and a comparator 16' which correspond to RAM section 14 and comparator 16 of FIG. 1. C-RAM 38 also includes a bidirectional bus driver 40 and function select logic 42.

RAM 14' is addressed by the pointer signal PTR on pointer/address bus 26, and inputs and outputs data on a bidirectional RAM data bus 44. RAM 14' is put into a read or write mode by a R/$\overline{\text{W}}$ signal on a line 46.

Comparator 16' is enabled by an $\overline{\text{ENABLE}}$ signal on a line 48 which is derived from OR gate 50. The inputs to OR gate 50 are a comparison ($\overline{\text{COMP}}$) signal on line 52, and an enable comparison ($\overline{\text{ENCOMP}}$) signal on a line 54. Thus, using negative logic, comparator 16' is enabled only when $\overline{\text{COMP}}$ and $\overline{\text{ENCOMP}}$ are both activated.

When enabled, comparator 16' compares the PR value on a bidirectional PR/data bus $5^5$ with the TR value on bidirectional RAM data bus 44. The result of the comparison can be output on resultant lines 56, 58, and 60 which correspond to less than, equal, and greater than. Of course, more or fewer resultant outputs can be produced, if desired.

Bidirectional bus driver 40 is disabled by a LO logic level on the $\overline{\text{COMP}}$ signal line 52. The bidirectional bus driver 40 is placed in the transmit or receive (T/$\overline{\text{R}}$) mode by the R/$\overline{\text{W}}$ signal on line 46 and is enabled when the $\overline{\text{COMP}}$ input signal is a logic HI level. Thus, the RAM can only be accessed (read or written) via the external data bus during a memory read or write cycle, but not during a compare cycle. An inverter 59 and an OR gate 61 ensure that RAM 14' is forced into read mode when $\overline{\text{COMP}}$ line 52 is LO as required for the proper operation of the C-RAM 38. When in the transmit mode, the direction of data flow is indicated by arrowhead 62, and when in receive mode the data flow is in the direction indicated by arrowhead 64. When the bus driver is not enabled (i.e. during a compare cycle), its outputs are tri-stated.

Function select logic 42 is controlled by a function control word F on a function control bus 66. If the function control bus 66 includes three lines, eight possible comparisons can be selected. However, with the comparator 16', only five comparisons are possible including less than, less than or equal to, equal to, greater than, and greater than or equal to. To implement other comparisons such as "between the limits of", an extra comparator, latch, and combinational logic, would be required. If the combined signals on resultant lines 56–60 meet the requirements selected by F, a match flag $\overline{\text{MATCH}}$ is developed by function select logic 42 on a line 68.

To randomly access RAM 14' the $\overline{\text{COMP}}$ input is put in a HI state to enable bus driver 40 and disable comparator 16'. If a HI signal is placed on R/$\overline{\text{W}}$ line 46, the read mode on RAM 14' will be selected, as will the transmit mode of the bidirectional bus driver. Alternatively, if a LO signal is placed on R/$\overline{\text{W}}$ line 46, the write mode of RAM 14' will be selected, as will be the receive direction for bus driver 40.

Referring now to FIG. 4, the horizontal cascading of a number of C-RAMs 38 is shown. The comparand bus 18 is first split into comparand CAM field PC and comparand RAM field PR, and then comparand RAM field PR is split into a first comparand RAM subfield $PR_0$ and a second comparand RAM subfield $PR_1$. Comparand CAM field is applied to a CAM 12" which functions essentially the same as the previously described CAM sections 12 and 12'.

CAM 12" is responsive to function control bus 66 and R/$\overline{\text{W}}$ line 46. If a comparison function is selected by function control bus 66, and a valid comparison is found between PC and a stored content, CAM 12" will develop a valid pointer ($\overline{\text{VALPTR}}$) signal on a line 54a and a pointer PTR on pointer/address bus 26.

C-RAM 38a is addressed by pointer/address bus 26, and is function selected by function control bus 66. C-RAM 38a is also responsive to R/$\overline{\text{W}}$ line 46 and $\overline{\text{COMP}}$ line 52. C-RAM 38a is enabled for a comparison by the $\overline{\text{VALPTR}}$ signal on line 54a, and performs the comparison on comparand RAM subfield $PR_0$. If a favorable comparison is made within C-RAM 38a, a $\overline{\text{MATCH}}$ signal is developed on a line 54b which enables the $\overline{\text{ENCOMP}}$ input of C-RAM 38b. C-RAM 38b is similarly addressed by pointer/address bus 26, and is functionally controlled by function control bus 66, R/$\overline{\text{W}}$ line 46, and $\overline{\text{COMP}}$ line 52. A $\overline{\text{MATCH}}$ signal is developed on a line 54c when there is a favorable comparison between comparand RAM subfield PR₁ and the content of C-RAM 38b addressed by pointer/address bus 26. Virtually any number of C-RAMs 38 can be horizontally cascaded in this manner.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A quasi content addressable memory circuit comprising:
   CAM means responsive to a first portion of a comparand, said CAM means being operative to develop a valid pointer signal and a pointer address when there is at least one favorable comparison between said first portion of said comparand and data stored within said CAM means;
   comparator RAM means responsive to a second portion of said comparand, said valid pointer signal, and said pointer address, and operative to produce a match signal when enabled by said valid pointer signal and when the content of a memory location addressed by said pointer address compares favorably with said second portion of said comparand;
   said comparator RAM means including bidirectional bus driver means responsive to a comparison signal and to a read/write signal for determining either a comparison or read/write mode of operation; and
   said comparator RAM means including function select logic means responsive to a function control word for selecting one of a plurality of comparisons between the content of the memory location addressed by said pointer address and said second portion of said comparand to develop said match signal.

2. A quasi content addressable memory circuit as recited in claim 1 wherein said comparator RAM means is a first comparator RAM means producing a first match signal, and further comprising a second comparator RAM means responsive to a third portion of said comparand, said pointer address, and said first match signal of said first comparator RAM means, said second comparator RAM means being operative to produce a second match signal when enabled by said first match signal and when the content of a memory location addressed by said pointer address compares favorably with said third portion of said comparand.

3. A quasi content addressable memory circuit as recited in claim 1 wherein said comparator RAM means includes a plurality of comparator RAM circuits, where a first comparator RAM circuit is responsive to a part of said second portion of said comparand, said valid pointer signal, and said pointer address and is operative to produce a match signal when enabled by said valid pointer signal and when the contents of a memory location addressed by said pointer address compares favorably with said part of said second portion of said comparand; and where the remainder of said comparator RAM circuits are responsive to parts of said second portion of said comparand, a match signal from another comparator RAM circuit, and said pointer address, and are operative to produce their own match signal when the content of one of their memory locations addressed by said pointer address compares favorably with the part of said second portion of said comparand to which they are responsive.

4. A quasi content addressable memory circuit comprising:
   CAM means including a plurality of content addressable memory locations, each CAM memory location being formed of a CAM memory location content field and an associated location pointer;
   said CAM means being responsive to a CAM comparand portion of a comparand for comparing said CAM comparand portion in parallel to all of the memory location content fields and for generating a pointer valid signal and a RAM pointer address developed from the corresponding associated location pointer at a particular CAM memory location content field when said CAM comparand portion compares favorably with the contents of at least one of said CAM memory location content fields;
   RAM means including a plurality of randomly addressable RAM memory locations, each RAM memory location being formed of a RAM content field, said RAM means being responsive to said RAM pointer address for generating a RAM data output corresponding to a particular RAM content field addressed by said RAM pointer address; and
   comparison means for comparing a RAM comparand portion of said comparand with said RAM data output and for generating a match flag when said RAM comparand portion compares favorable with said RAM data output, said comparison means being responsive to said pointer valid signal for enabling and disabling of the same.

5. A quadi content addressable memory circuit as recited in claim 4 wherein said CAM means further includes multiple response handling means responsive to the comparisons between said CAM comparand portion and said CAM memory locations, and operative to produce a series of RAM pointer addresses when there are multiple favorable comparisons.

6. A quasi content addressable memory circuit as recited in claim 5 wherein said multiple response handling means includes a priority encoder which prioritizes and sequences a series of RAM pointer addresses when there are multiple favorable responses.

* * * * *